United States Patent
Jongill et al.

(10) Patent No.: US 6,759,120 B2
(45) Date of Patent: Jul. 6, 2004

(54) MAGNETORESISTIVE FILM, MAGNETORESISTIVE HEAD, INFORMATION REGENERATION APPARATUS AND MAGNETORESISTIVE FILM MANUFACTURE METHOD

(75) Inventors: Hong Jongill, Kawasaki (JP); Kenichi Aoshima, Kawasaki (JP); Kenji Noma, Kawasaki (JP); Junichi Kane, Kawasaki (JP); Hitoshi Kanai, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 223 days.

(21) Appl. No.: 09/726,752

(22) Filed: Nov. 30, 2000

(65) Prior Publication Data

US 2001/0014412 A1 Aug. 16, 2001

(30) Foreign Application Priority Data

Feb. 10, 2000 (JP) ........................................ 2000-033698

(51) Int. Cl.$^7$ .............................. G11B 5/31; G11B 5/33; G11B 5/39
(52) U.S. Cl. ........................ 428/336; 428/692; 428/911; 360/314; 360/324; 360/324.1; 427/129; 427/457
(58) Field of Search ................................. 428/692, 911, 428/336; 360/324, 324.1, 324.12, 314–321, 327, 324.11; 427/457, 129

(56) References Cited

U.S. PATENT DOCUMENTS

| | | | |
|---|---|---|---|
| 5,897,969 A | * 4/1999 | Taniyama et al. | 428/692 |
| 6,245,450 B1 | * 6/2001 | Kawawake et al. | 428/692 |
| 6,490,139 B1 | * 12/2002 | Hayashi et al. | 360/322 |
| 2001/0050834 A1 | * 12/2001 | Hasegawa et al. | 360/324.1 |

FOREIGN PATENT DOCUMENTS

| EP | 490 608 | 6/1992 |
|---|---|---|
| JP | 10041561 | 2/1998 |

OTHER PUBLICATIONS

J.J. deVries et al.; "Oscillatory Interlayer Exchange Coupling with the Cu Cap Layer Thickness in Co/Cu/Co/Cu(100)"; *Physical Review Letters*; vol. 75, No. 23; pp. 4306–4309; Dec. 4, 1995.

T.R. McGuire et al; "Magnetoresistance and exchange effects of NiCo/Cu sandwich films with oxide overlayer"; *Journal of Applied Physics*; vol. 75, No. 10, Part 2B, pp. 6537–6539; May 15, 1994.

K. Matsuyama et al.; "Perpedicular spin valve behavior in a microstructrued Co/Cu–Cu oxide/Co trilayer"; *Journal of Applied Physics*; vol. 79, No. 8, Part 2A, pp. 5318–5320; Apr. 15, 1996.

Jongill Hong et al.; "Effect of Thin Oxide Capping on Interlayer Coupling in Spin Valves", *IEEE Transactions on Magnetics*, Vo. 36, No. 5, pp. 2629–2631; Sep. 2000.

* cited by examiner

*Primary Examiner*—Paul Thibodeau
(74) *Attorney, Agent, or Firm*—Greer, Burns & Crain, Ltd.

(57) ABSTRACT

There is disclosed a magnetoresistive film in which increase of a coupling field accompanying thickness reduction of a middle layer is inhibited. The magnetoresistive film is a multilayered film including a pinned layer 3 having magnetization whose direction is fixed, a nonmagnetic middle layer 4 formed on the pinned layer, and a free layer 5 formed on the middle layer and provided with magnetization whose direction changes in accordance with an external magnetic field, the magnetoresistive film indicates a magnitude of resistance in accordance with an angle formed by the magnetization direction of the pinned layer and the magnetization direction of the free layer, and a copper oxide layer 7 of an oxide including a copper element is formed directly on the free layer, or on the free layer via an oxide layer 6 of a material fabricated by oxidizing a material constituting the free layer.

13 Claims, 7 Drawing Sheets

MAGNETORESISTIVE FILM, MAGNETORESISTIVE HEAD, INFORMATION REGENERATION APPARATUS AND MAGNETORESISTIVE FILM MANUFACTURE METHOD

BACKGROUND OF THE INVENTION i) Field of the Invention

The present invention relates to a magnetoresistive film whose resistance changes in accordance with a magnetic field intensity, a magnetoresistive head for detecting the magnetic field intensity in accordance with the resistance change of the magnetoresistive film, an information regeneration apparatus for regenerating information recorded in a recording medium, and a magnetoresistive film manufacture method for manufacturing the magnetoresistive film.

ii) Description of Related Art

In recent years, with spread of a computer, a large amount of information has been handled in a daily manner. Such information is recorded on a recording medium by a large number of physical marks, and regenerated by an information regeneration apparatus for reading the mark on the recording medium to regenerate an electric regeneration signal.

A hard disk drive (HDD) is one of the information regeneration apparatuses, and is characterized in that a memory capacity is large and access speed to the information is fast. The HDD is provided with a magnetic disk as the recording medium whose surface is formed of a magnetic material, and a regeneration head for regenerating the information recorded on the magnetic disk. For the magnetic disk, a surface is magnetized for each micro area (one-bit region), and one bit of information is recorded in a form of a magnetization direction of the one-bit region. The regeneration head is disposed in the vicinity of the magnetic disk, and outputs an electric regeneration signal in accordance with a signal magnetic field $H_{sig}$ generated from the magnetization of one-bit region of the magnetic disk to regenerate the information recorded on the magnetic disk.

At present, in many of the regeneration heads mounted on the HDD, a magnetoresistive head (MR head) including a magnetoresistive film whose resistance changes in accordance with the magnetic field from the outside is used. In the MR head, a pair of electrode terminals are disposed on La the magnetoresistive film, and during operation a sense current is passed to the magnetoresistive film from the pair of the electrode terminals. In such sense current flow state, when the MR head is relatively moved in the vicinity of the magnetic disk, an electric resistivity of the magnetoresistive film successively changes in accordance with the signal magnetic field $H_{sig}$ from the magnetic disk, and a high-output regeneration signal with a voltage of a value represented by a product of the electric resistivity and the sense current value is outputted.

However, a recording density of the magnetic disk continues to be enhanced year by year, an area of one-bit region decreases with enhancement of the recording density, the signal magnetic field $H_{sig}$ generated from the one-bit region is weakened, and the regeneration head for outputting a large regeneration signal is therefore necessary even for this weak signal magnetic field $H_{sig}$. As the regeneration head for outputting the large regeneration signal, a spin valve magnetoresistive head which is a magnetoresistive head utilizing a giant magnetoresistive (GMR) effect is disclosed by Japanese Patent Application Laid-Open No. 358310/1992, and practical use is starting in earnest.

The spin valve magnetoresistive head is provided with a spin valve magnetoresistive film as a multilayered film including a free magnetic layer (free layer) whose magnetization direction changes in accordance with the external magnetic field, a middle layer formed adjacent to the free layer and constituted of a nonmagnetic metal, a pinned magnetic layer (pinned layer) whose magnetization direction is fixed in a predetermined direction, and an antiferromagnetic layer formed adjacent to the pinned layer and constituted of an antiferromagnetic material for fixing the magnetization direction of the pinned layer. For the magnetoresistive film, when the external magnetic field changes, the magnetization direction of the free layer of the magnetoresistive film changes, and a resistance change is a generated in accordance with relative angle changes of the magnetization directions of the pinned layer and free layer.

Since an output of the regeneration signal of the magnetoresistive head provided with the magnetoresistive film is substantially proportional to a difference $\Delta\rho/t$ between a maximum value and a minimum value of a sheet resistance changing in accordance with the external magnetic field change, with respect to the magnetoresistive effect, an ability of the magnetoresistive film is evaluated by this difference $\Delta\rho/t$ in many cases. The difference $\Delta\rho/t$ between the maximum value and the minimum value of the changing sheet resistance will be hereinafter referred to as resistance change $\Delta\rho/t$. Since the aforementioned spin valve magnetoresistive film has a large resistance change $\Delta\rho/t$, the high-output regeneration signal can be obtained from the magnetoresistive head provided with the magnetoresistive film.

The spin valve magnetoresistive head outputs the high-output regeneration signal in this manner, but it is demanded that a higher output be obtained by further increasing the resistance change $\Delta\rho/t$ of the magnetoresistive film. As a measure for increasing the resistance change $\Delta\rho/t$, a thickness of the middle layer is reduced. When the thickness of the middle layer is too large, an excess shunt current not contributing to the magnetoresistive effect flows in the middle layer to decrease the resistance change $\Delta\rho/t$, but the decrease of the resistance change $\Delta\rho/t$ is suppressed by setting the middle layer to be thin.

However, in the conventional magnetoresistive film, an interlayer coupling field Hen usually acts between the magnetization of the free layer and the magnetization of the pinned layer to set these magnetization directions to be the same direction, and with further thinning of the middle layer, the coupling field $H_{in}$ increases. In the following, the coupling field $H_{in}$ has a positive value when the magnetization directions are set to be the same direction, and has a negative value when the directions are set to be directions opposite to each other. By this coupling field $H_{in}$, a deviation is generated in an angle formed by the magnetization direction of the free layer and the magnetization direction of the pinned layer.

In general, the resistivity of the magnetoresistive film preferably linearly changes with respect to the change of the signal magnetic field H.,g from the magnetic disk, and to realize this linear change, it is ideal to form an angle of 90° C. by the magnetization directions of the pinned layer and free layer in the absence of the signal magnetic field $H_{sig}$. However, when the angle deviates from 90° by the coupling field $H_{in}$, the output voltage of the spin valve magnetoresistive head fails to linearly respond to an input of signal magnetic field $H_{sig}$, and strain of a regeneration waveform of the output voltage or another trouble occurs.

SUMMARY OF THE INVENTION

The present invention has been developed in consideration of the aforementioned situations, and an object thereof is to provide a magnetoresistive film in which increase of coupling field with thickness reduction of a middle layer is inhibited, a magnetoresistive head provided with the magnetoresistive film, an information regeneration apparatus provided with the magnetoresistive head, and a magnetoresistive film manufacture method for manufacturing the magnetoresistive film.

Among magnetoresistive films of the present invention for attaining the aforementioned object, a first magnetoresistive film is a multilayered film including: a pinned magnetic layer having magnetization whose direction is fixed; a nonmagnetic middle layer formed on the pinned magnetic layer; and a free magnetic layer formed on the middle layer and provided with magnetization whose direction changes in accordance with an external magnetic field, and indicates a magnitude of resistance in accordance with an angle formed by the magnetization direction of the pinned magnetic layer and the magnetization direction of the free magnetic layer.

A copper oxide layer of an oxide including a copper element is formed directly on the free magnetic layer, or on the free magnetic layer via an oxide layer formed of a material fabricated by oxidation of a material constituting the free magnetic layer.

Here, the copper oxide layer may be formed adjacent onto the free magnetic layer, or formed on the free magnetic layer via a predetermined layer.

Like the first magnetoresistive film of the present invention, when the copper oxide layer comprising the oxide including the copper element is formed directly on the free magnetic layer, or on the free magnetic layer via the oxide layer, as described later in an example, a value of the aforementioned coupling field Hi decreases, and the increase of the coupling field H,n accompanying the thickness reduction of the middle layer is inhibited.

In general, the resistance change of the magnetoresistive film in a magnetoresistive effect is generated by a change of a magnitude of an average free stroke in the magnetoresistive film by spin dependence scattering of a conductive electron in accordance with the external magnetic field, and the change of the magnitude of the average free stroke increases by specular reflection.

In the first magnetoresistive film of the present invention, when the copper oxide layer is formed directly on the free magnetic layer, on an interface between the free magnetic layer and the copper oxide layer, the conductive electron is specularly reflected while keeping its spin state. When the copper oxide layer is formed on the free magnetic layer via the oxide layer, the specular reflection occurs on the interface between the free magnetic layer and the oxide layer, and on the interface between the oxide layer and the copper oxide layer. Therefore, the first magnetoresistive film of the present invention indicates a large resistance change $\Delta\rho/t$ by the occurrence of the specular reflection on these interfaces.

In the magnetoresistive film of the present invention, the copper oxide layer preferably has a thickness of 10 angstroms or more.

As described later in the example, when the copper oxide layer has the thickness of 10 angstroms or more, the inhibition of the increase of the coupling field $H_{in}$ is effectively performed.

Moreover, when the magnetoresistive film of the present invention is provided with the oxide layer, the oxide layer preferably has a thickness of 5 angstroms or more.

For the first magnetoresistive film, since the thickness of the oxide layer is 5 angstroms or more, as described later in the example, the coupling field $H_{in}$ is small, and the specular reflection of the conductive electron is satisfactorily performed on the interface between the free magnetic layer and the oxide layer.

Moreover, for the first magnetoresistive film of the present invention, a protective layer for protecting the copper oxide layer is preferably formed on the copper oxide layer.

For the first magnetoresistive film provided with the protective layer, the protective layer preferably comprises an oxide.

In the first magnetoresistive film in which the protective layer comprises the oxide, the protective layer preferably comprises $Al_2O_3$.

The copper oxide layer is physically protected, and further prevented from being oxidized or chemically protected otherwise by the protective layer.

Moreover, in the first magnetoresistive film of the present invention, the free magnetic layer preferably has a thickness of 30 angstroms or less.

For the conductive electron in the magnetoresistive film, the average free stroke by usual scattering without depending on spin is about 60 angstroms. When the thickness of the free magnetic layer is 30 angstroms or more, the conductive electron is easily scattered before specularly reflected by the interface between the free magnetic layer and the copper oxide layer, and the increase of the resistance change $\Delta\rho/t$ by the specular reflection is therefore small. On the other hand, in the magnetoresistive film in which the thickness of the free magnetic layer is 30 angstroms or less, the increase of the resistance change $\Delta\rho/t$ by the specular reflection is large.

Among the magnetoresistive films of the present invention for attaining the aforementioned object, a second magnetoresistive film is a multilayered film including: a pinned magnetic layer having magnetization whose direction is fixed: a nonmagnetic middle layer formed on the pinned magnetic layer; and a free magnetic layer formed on the middle layer and provided with magnetization whose direction changes in accordance with an external magnetic field, and indicates a magnitude of resistance in accordance with an angle formed by the magnetization direction of the pinned magnetic layer and the magnetization direction of the free magnetic layer.

The middle layer has a thickness of 34 angstroms or less.

A coupling layer for exerting a coupling field for directing the magnetization of the pinned magnetic layer and the magnetization of the free magnetic layer in opposite directions between the magnetizations is formed on the free magnetic layer.

For example, in the first magnetoresistive film of the present invention, the coupling layer corresponds to the copper oxide layer, or a composite layer of the copper oxide layer and oxide layer, but the coupling layer is not limited to these layers, and may be any layer as long as the coupling field for directing the magnetization of the pinned magnetic layer and the magnetization of the free magnetic layer in the opposite directions is exerted between the magnetizations.

For the magnetoresistive film heretofore put to practical use, the thickness of the middle layer is 34 angstroms or less, the coupling field $H_{in}$ for directing the magnetizations in the same direction acts on the first magnetoresistive film, and the coupling field $H_{in}$ increases by reducing the thickness of the middle layer. On the other hand, since the second magnetoresistive film includes the coupling layer, even with the thickness of the middle layer of 34 angstroms or less, the value of the coupling field becomes negative, and the value of the coupling field $H_{in}$ can therefore be brought close to zero by reducing the thickness of the middle layer.

Among magnetoresistive heads of the present invention for attaining the aforementioned object, a first magnetoresistive head is provided with a magnetoresistive film as a multilayered film including: a pinned magnetic layer having magnetization whose direction is fixed; a nonmagnetic middle layer formed on the pinned magnetic layer: and a free magnetic layer formed on the middle layer and provided with magnetization whose direction changes in accordance with an external magnetic field, and indicating a magnitude of resistance in accordance with an angle formed by the magnetization direction of the pinned magnetic layer and the magnetization direction of the free magnetic layer. The magnetoresistive head detects the magnitude of the resistance of the magnetoresistive film to detect a strength of the external magnetic field.

A copper oxide layer of an oxide including a copper element is formed directly on the free magnetic layer, or on the free magnetic layer via an oxide layer formed of a material fabricated by oxidation of a material constituting the free magnetic layer.

In general, it is ideal to form an angle of 90° C. by the magnetization directions of the pinned magnetic layer and free magnetic layer, for use in the magnetoresistive head, in the absence of the signal magnetic field $H_{sig}$. However, when excess magnetic fields such as the coupling field $H_{in}$ exist, the angle deviates from 90°. When the angle deviates from 90°, a regeneration waveform of a regeneration signal outputted from the magnetoresistive head is strained.

Since the first magnetoresistive head employs the first magnetoresistive film of the present invention as the magnetoresistive film, and the increase of the excess coupling field $H_{in}$ accompanying the decrease of the thickness of the middle layer is inhibited, the strain of the regeneration waveform is inhibited in the first magnetoresistive head.

Among magnetoresistive heads of the present invention for attaining the aforementioned object, a second magnetoresistive head is provided with a magnetoresistive film as a multilayered film including: a pinned magnetic layer having magnetization whose direction is fixed; a nonmagnetic middle layer formed on the pinned magnetic layer; and a free magnetic layer formed on the middle layer and provided with magnetization whose direction changes in accordance with an external magnetic field, and indicating a magnitude of resistance in accordance with an angle formed by the magnetization direction of the pinned magnetic layer and the magnetization direction of the free magnetic layer. The magnetoresistive head detects the magnitude of the resistance of the magnetoresistive film to detect a strength of the external magnetic field.

The middle layer has a thickness of 34 angstroms or less.

A coupling layer for exerting a coupling field for directing the magnetization of the pinned magnetic layer and the magnetization of the free magnetic layer in opposite directions between the magnetizations is formed on the free magnetic layer.

Since the second magnetoresistive head employs the second magnetoresistive film of the present invention as the magnetoresistive film, and the value of the coupling field $H_{in}$ can be brought close to zero by further reducing the thickness of the middle layer, the strain of the regeneration waveform can be inhibited in the second magnetoresistive head.

Among information regeneration apparatuses of the present invention for attaining the aforementioned object, a first information regeneration apparatus is provided with a magnetic head, disposed in the vicinity of or in contact with a magnetic recording medium on which information is recorded by a magnetization direction, for detecting the magnetization direction of each point of the magnetic recording medium, and regenerates the information in accordance with the magnetization direction of each point of the magnetic recording medium detected by the magnetic head.

The magnetic head is provided with a magnetoresistive film as a multilayered film including: a pinned magnetic layer having magnetization whose direction is fixed; a nonmagnetic middle layer formed on the pinned magnetic layer; and a free magnetic layer formed on the middle layer and provided with magnetization whose direction changes in accordance with an external magnetic field, and indicating a magnitude of resistance in accordance with an angle formed by the magnetization direction of the pinned magnetic layer and the magnetization direction of the free magnetic layer. The magnetoresistive head detects the magnitude of the resistance of the magnetoresistive film to detect a strength of the external magnetic field. A copper oxide layer of an oxide including a copper element is formed directly on the free magnetic layer, or on the free magnetic layer via an oxide layer formed of a material fabricated by oxidation of a material constituting the free magnetic layer.

The first information regeneration apparatus employs the first magnetoresistive head of the present invention in the magnetic head. Similarly as the first magnetoresistive head, since the magnetic head has the strain of the regeneration waveform inhibited, the first information regeneration apparatus is high in sensitivity for detecting the magnetization direction of each point of the magnetic recording medium, and suitable for the regeneration of the information recorded with a high density on the magnetic recording medium.

Among the information regeneration apparatuses of the present invention for attaining the aforementioned object, a second information regeneration apparatus is provided with a magnetic head, disposed in the vicinity of or in contact with a magnetic recording medium on which information is recorded by a magnetization direction, for detecting the magnetization direction of each point of the magnetic recording medium, and regenerates the information in accordance with the magnetization direction of each point of the magnetic recording medium detected by the magnetic head.

The magnetic head is provided with a magnetoresistive film as a multilayered film including: a pinned magnetic layer having magnetization whose direction is fixed; a nonmagnetic middle layer formed on the pinned magnetic layer; and a free magnetic layer formed on the middle layer and provided with magnetization whose direction changes in accordance with an external magnetic field, and indicating a magnitude of resistance in accordance with an angle formed by the magnetization direction of the pinned magnetic layer and the magnetization direction of the free magnetic layer. The magnetoresistive head detects the magnitude of the resistance of the magnetoresistive film to detect a strength of the external magnetic field.

The middle layer has a thickness of 34 angstroms or less.

A coupling layer for exerting a coupling field for directing the magnetization of the pinned magnetic layer and the magnetization of the free magnetic layer in opposite directions between the magnetizations is formed on the free magnetic layer.

The second information regeneration apparatus employs the second magnetoresistive head of the present invention in the magnetic head. Similarly as the second magnetoresistive head, in the magnetic head, since the strain of the regeneration waveform is inhibited, the second information regeneration apparatus is high in sensitivity for detecting the magnetization direction of each point of the magnetic recording medium, and suitable for the regeneration of the information recorded with a high density on the magnetic recording medium.

Among magnetoresistive film manufacture methods of the present invention for attaining the aforementioned object, there is provided a first magnetoresistive film manufacture method for manufacturing a magnetoresistive film as a multilayered film including: a pinned magnetic layer having magnetization whose direction is fixed; a nonmagnetic middle layer formed on the pinned magnetic layer; and a free magnetic layer formed on the middle layer and provided with magnetization whose direction changes in accordance with an external magnetic field, and indicating a magnitude of resistance in accordance with an angle formed by the magnetization direction of the pinned magnetic layer and the magnetization direction of the free magnetic layer.

The method includes: a free magnetic material layer lamination step of laminating the middle layer, and subsequently laminating a free magnetic material layer including a material constituting the free magnetic layer on the middle layer;
    a metal layer lamination step of laminating a metal layer including a metal on the free magnetic material layer laminated in the free magnetic material layer lamination step; and
    a plasma oxidation step of exposing the metal layer laminated by the metal layer lamination step to oxygen in a plasma state to oxidize the metal layer.

In the magnetoresistive film finally formed through these respective steps, the free magnetic material layer itself, or a partial layer of a thickness direction in the free magnetic material layer constitutes the free magnetic layer.

According to the first magnetoresistive film manufacture method, as described later in the example, by oxidation of the metal layer laminated on the free magnetic material layer in the plasma oxidation step, the magnetoresistive film is manufactured in which the coupling field $H_{in}$ is reduced and the increase of the coupling field $H_{in}$ accompanying the thickness reduction of the middle layer is inhibited.

In the first magnetoresistive film manufacture method of the present invention, the plasma oxidation step preferably includes a step of oxidizing the metal layer, and a part of the free magnetic material layer on the side of the metal layer.

In a conventional art, an oxide film is sometimes formed on the free magnetic layer by natural oxidation, but it is difficult to form the oxide film with a controlled desired thickness depending on the natural oxidation. Moreover, although the oxide film can be formed directly on the free magnetic layer by performing plasma oxidation, in the direct plasma oxidation, by excessively strong oxidation, it is still difficult to form the oxide film with the controlled desired thickness.

On the other hand, since the first magnetoresistive manufacture method comprises forming the metal layer on the free magnetic material layer comprising the material constituting the free magnetic layer, and oxidizing a part of the free magnetic material layer through the metal layer by the plasma oxidation step, during formation, the oxide layer fabricated by oxidation of the free magnetic material layer can be controlled to provide the desired thickness. Moreover, by forming the oxide layer whose thickness is controlled, the coupling field $H_{in}$ can be controlled.

Furthermore, in the first magnetoresistive film manufacture method of the present invention, the metal layer laminated in the metal layer lamination step preferably includes copper or a copper alloy.

In this metal layer of copper or the copper alloy, control of the coupling field $H_{in}$ is effectively performed.

Moreover, in the first magnetoresistive film manufacture method, the plasma oxidation step is preferably performed simultaneously with lamination of a new layer on the metal layer.

In the first magnetoresistive film manufacture method including the lamination of the new layer, the new layer preferably comprises the oxide.

In the first magnetoresistive film manufacture method including the lamination of the new layer comprising the oxide, the new layer may comprise $Al_2O_3$.

By laminating the oxide, and the like on the metal layer by sputtering or the like in this manner, for example, the new layer having a function of protecting the metal layer is formed, and additionally the metal layer can be oxidized.

In the first magnetoresistive film manufacture method of the present invention, the plasma oxidation step is preferably performed in an atmosphere including at least one of Ar and oxygen.

When the plasma oxidation step includes, for example, a step of laminating the new layer comprising the oxide onto the metal layer by sputtering or the like, even with the sputtering performed in the atmosphere including Ar but including no oxygen, the metal layer is plasma-oxidized.

Moreover, when the plasma oxidation step does not include the step of lamination of the new layer, the atmosphere including oxygen is used to perform the plasma oxidation.

Furthermore, in the atmosphere of mixture of Ar and oxygen, the thickness of the oxide layer can be controlled by change of a mixture ratio, and the like.

Additionally, even when the plasma oxidation step is performed simultaneously with the lamination of the oxide, by performing the step in the atmosphere including oxygen, the coupling field $H_{in}$ of the magnetoresistive film manufactured by the first magnetoresistive film manufacture method tends to be reduced.

In the first magnetoresistive film manufacture method of the present invention, in the metal layer lamination step, the metal layer is preferably formed in a thickness of 10 angstroms or more.

In the magnetoresistive film manufactured by forming the metal layer in the thickness of 10 angstroms or more, as described later in the example, the reduction of the coupling field $H_{in}$ can effectively be performed.

Moreover, in the first magnetoresistive film manufacture method of the present invention, in the plasma oxidation step, the free magnetic material layer is preferably oxidized to a depth of 5 angstroms or more in a thickness direction from a metal layer side.

When the free magnetic material layer is oxidized to the depth of 5 angstroms or more, as described later in the example, the coupling field $H_{in}$ is small, and the specular reflection of the conductive electron is satisfactorily performed on an interface of the free magnetic material layer between an oxidized portion and a non-oxidized remaining portion.

Moreover, in the first magnetoresistive film manufacture method of the present invention, for the entire thickness of the free magnetic material layer, the thickness of the portion which has not been oxidized in the plasma oxidation step is preferably 30 angstroms or less.

As described above, in the magnetoresistive film in which for the thickness of the free magnetic layer, that is, the entire thickness of the free magnetic material layer, the thickness of the non-oxidized portion is 30 angstroms or less, the specular reflection of the conductive electron on the interface of the free magnetic material layer between the oxidized portion and the non-oxidized remaining portion largely contributes to the increase of the resistance change $\Delta\rho/t$.

Among the magnetoresistive film manufacture methods of the present invention for attaining the aforementioned object, there is provided a second magnetoresistive film manufacture method for manufacturing a magnetoresistive film as a multilayered film including: a pinned magnetic layer having magnetization whose direction is fixed; a nonmagnetic middle layer formed on the pinned magnetic layer; and a free magnetic layer formed on the middle layer and provided with magnetization whose direction changes in accordance with an external magnetic field, and indicating a magnitude of resistance in accordance with an angle formed by the magnetization direction of the pinned magnetic layer and the magnetization direction of the free magnetic layer.

The method includes: a free magnetic material layer lamination step of laminating a free magnetic material layer comprising a material constituting the free magnetic layer on the middle layer;

an oxidation control layer lamination step of laminating a predetermined oxidation control layer on the free magnetic material layer laminated in the free magnetic material layer lamination step; and a plasma oxidation step of exposing the oxidation control layer laminated by the oxidation control layer lamination step to oxygen in a plasma state to oxidize the free magnetic material layer to a predetermined depth in a thickness direction from an oxidation control layer side through the oxidation control layer.

The oxidation control layer corresponds, for example, to the metal layer laminated in the metal layer lamination step in the first magnetoresistive film manufacture method of the present invention, but this is not limited, and any layer may be used as long as the free magnetic material layer is oxidized to the predetermined depth in the thickness direction from the oxidation control layer side through the oxidation control layer by exposure to oxygen in the plasma state. In the second magnetoresistive film manufacture method, since the oxidized thickness of the free magnetic material layer is controlled by the oxidation control layer, the magnetoresistive film controlled to have a small coupling field $H_{in}$ is manufactured.

DETAILED DESCRIPTION OF THE PREFERRED EMBODIMENTS

A preferred embodiment of the present invention will be described hereinafter.

Figure 1:
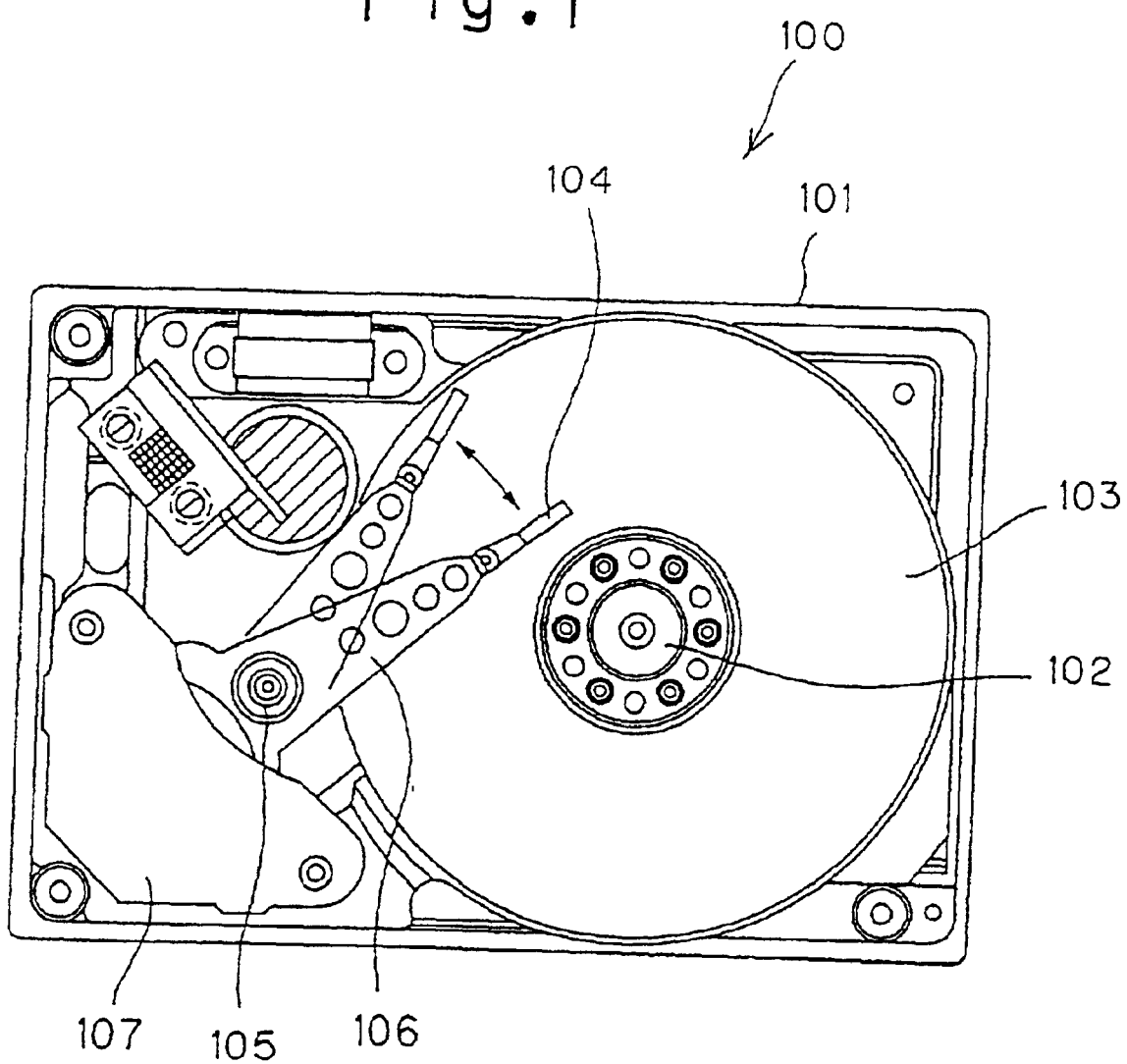
FIG. 1 is a schematic view of a hard disk drive of the present embodiment.

FIG. 1 is a schematic view of a hard disk drive of the present embodiment.

A hard disk drive (HDD) 100 shown in FIG. 1 corresponds to an information regeneration apparatus of the present invention. A housing 101 of the HDD 100 shown in FIG. 1 contains: a rotation shaft 102; a magnetic disk 103 attached to the rotation shaft 102, a floating head slider 104 disposed close to and opposite to the surface of the magnetic disk 103; an arm shaft 105; a carriage arm 106, provided with the floating head slider 104 fixed to a tip end thereof, for horizontally moving on the magnetic disk 103 centering on the arm shaft 105; and an actuator 107 for driving the horizontal movement of the carriage arm 106.

The HDD 100 performs recording of information in the magnetic disk 103, and regeneration of the information recorded in the magnetic disk 103. During the recording and regeneration of the information, first the actuator 107 constituted of a magnetic circuit drives the carriage arm 106, and the floating head slider 104 is positioned in a desired track on the rotating magnetic disk 103. A magnetic head, not shown in FIG. 1, of the present embodiment is mounted on the tip end of the floating head slider 104. The magnetic head corresponds to a magnetoresistive head of the present invention. The magnetic head successively approaches respective one-bit regions arranged on respective tracks of the magnetic disk 103 by rotation of the magnetic disk 103. During the information recording, an electric recording signal is inputted to the magnetic head disposed in the vicinity of the magnetic disk 103 in this manner, the magnetic head applies a magnetic field to each of the one-bit regions in response to the recording signal, and the information carried by the recording signal is recorded in the form of a magnetization direction of the one-bit region. Moreover, during the information regeneration, the magnetic head extracts the information recorded in the form of the magnetization direction of each one-bit region as an electric regeneration signal generated in accordance with the magnetic field generated from magnetization. An inner space of the housing 101 is closed by a cover (not shown).

The magnetic head of the present embodiment will next be described.

Figure 2:
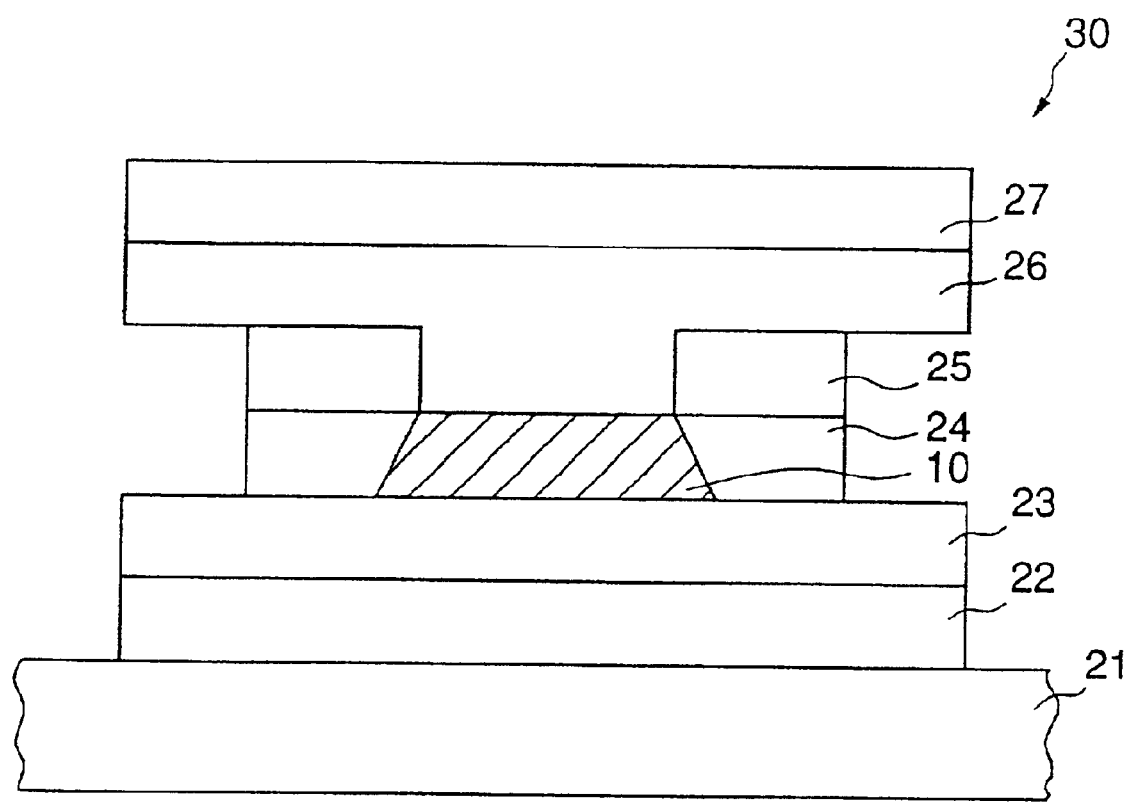
FIG. 2 is a main part perspective view of a magnetic head of the present embodiment.

FIG. 2 is a main part sectional view of the magnetic head of the present embodiment.

A magnetic head 30 of the present embodiment is a composite magnetic head provided with a recording section for recording the information in the magnetic disk 103 and a regeneration section for regenerating the information, and only the regeneration section is shown in FIG. 2. FIG. 2 is a sectional view of the regeneration section of the magnetic head cut along a plane parallel to the plane of the magnetic disk 103 shown in FIG. 1.

The magnetic head 30 includes a nonmagnetic substrate 21, a lower shield layer 22 formed on the nonmagnetic substrate 21, a lower insulation layer 23 formed on the lower shield layer 22, a magnetoresistive film 10 formed on the lower insulation layer 23, a pair of left and right magnetic domain control layers 24 formed on the lower insulation layer 23 to hold the magnetoresistive film 10 from both sides, a pair of left and right electrodes 25 formed on the pair of left and right magnetic domain control layers 24, an upper insulation layer 26 formed on the pair of left and right electrodes 25 and magnetoresistive film 10, and an upper shield layer 27 formed on the upper insulation layer 26. The recording head is formed on the upper shield layer 27.

The substrate 21 is constituted by forming an Si film or an SiO$_2$ film on a substrate formed, for example, of alumina titanium carbide (Al$_2$O$_3$—TiC).

Each of the lower shield layer 22 and upper shield layer 27 is a layer formed, for example, of FeN or another soft magnetic material with a thickness of 1.6 μm, and magnetically shields the magnetoresistive film 10 in such a manner that an unnecessary external magnetic field fails to be applied to the magnetoresistive film 10.

Each of the lower insulation layer 23 and upper insulation layer 26 is a layer formed, for example, of alumina (Al$_2$O$_3$) or another insulation material with a thickness of 50 nm, and prevents a current leak from the magnetoresistive film 10, magnetic domain control layer 24, and the pair of electrodes 25.

The magnetic domain control layer 24 is a layer formed, for example, of Co—Pt alloy, Co—Cr—Pt alloy or another material indicating a hard magnetic property, and applies a static magnetic field and a bias magnetic field by exchange interaction to the magnetoresistive film 10. Here, the magnetic domain control layer 24 is laminated to provide the same height as that of the magnetoresistive film 10.

The electrode 25 is formed, for example, of conductive materials such as a multilayered film of Ta/(Ti—W)/Ta consisting of two Ta layers and a Ti—W alloy held between these Ta layers, and applies a sense current to the magnetoresistive film 10 via the magnetic domain control layer 24. The regeneration signal is extracted from the pair of electrodes 25.

The magnetoresistive film 10 is a portion having a function of information regeneration of the magnetic head 30. Specifically, the resistance of the magnetoresistive film 10 changes in accordance with the magnetic field generated from the magnetization of each one-bit region of the magnetic disk 103. Since the electrode 25 applies the sense current to the magnetoresistive film 10 as described above, the information carried by the magnetization direction of each one-bit region is extracted as the electric regeneration signal by the resistance change.

A characteristic of the present invention lies in a structure of the magnetoresistive film 10. The structure of the magnetoresistive film 10 will next be described.

Figure 3:
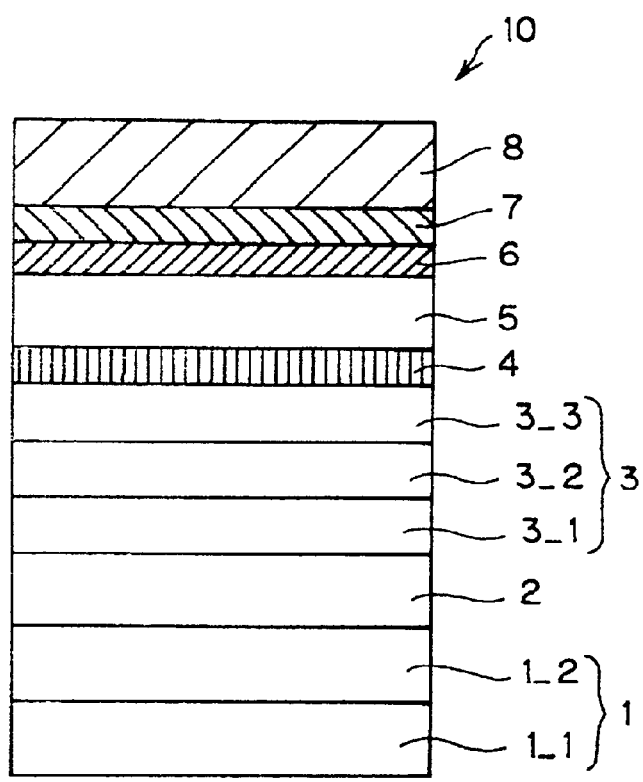
FIG. 3 is a sectional view of one example of a magnetoresistive film of the present embodiment.

FIG. 3 is a sectional view of one example of the magnetoresistive film of the present embodiment.

The magnetoresistive film lo shown in FIG. 3 is a spin valve magnetoresistive film, and is constituted of: an underlayer 1 formed on the lower insulation layer 23 shown in FIGS. 2, 3; an antiferromagnetic layer 2 formed on the underlayer 1; a pinned layer 3 formed on the antiferromagnetic layer 2; a middle layer 4 formed on the pinned layer 3; a free layer 5 formed on the middle layer 4; an oxide layer 6 formed on the free layer 5; a copper oxide layer 7 formed on the oxide layer 6; and a protective layer 8 formed on the copper oxide layer 7.

The underlayer 1 is constituted, for example, by forming a second underlayer 1_2 of an Ni—Fe alloy with a thickness of 16 angstroms on an underlayer 1_1 of Ta with a thickness of 50 angstroms. The second underlayer 1_2, formed on the first underlayer 1_1 of Ta, has an fcc structure and is oriented in (111) direction.

The antiferromagnetic layer 2 is a layer formed, for example of a Pd—Pt—Mn alloy or another antiferromagnetic material with a thickness of 150 angstroms. The antiferromagnetic layer 2 applies an exchange bias magnetic field accompanying an exchange coupling of the pinned layer 3.

The pinned layer 3 is here constituted of a soft magnetic layer 3_1 and a second soft magnetic layer 3_3 indicating soft magnetic properties, and a pin-coupled layer 3_2, held between these soft magnetic layers in a film thickness direction, for coupling magnetization of the soft magnetic layers in opposite directions.

The first soft magnetic layer 3_1 is, for example, a layer of an Co—Fe—B alloy with a thickness of 15 angstroms, and the second soft magnetic layer 3_3 is, for example, a layer of the Co—Fe—B alloy with a thickness of 25 angstroms. Moreover, the pin-coupled layer 3_2 is, for example, a layer of Ru with a thickness of 7.5 angstroms.

For the soft magnetic layer 3_1 of the pinned layer 3, the magnetization is fixed by the exchange bias magnetic field applied by the antiferromagnetic layer 2 in a direction vertical to a sheet surface of the FIG. 2, that is, a height direction of the magnetoresistive film which connects the pair of electrodes 25 shown in FIG. 2 to each other, which is vertical to a longitudinal direction of the magnetoresistive film and which is parallel to the respective layers such as the pinned layer.

On the other hand, for the second soft magnetic layer 3_3 of the pinned layer 3, the magnetization is fixed by the pin-coupled layer 3_2 in such a manner that the magnetization is directed in a direction opposite to the magnetization direction of the first soft magnetic layer 3_1. Since the magnetization of the first soft magnetic layer 3_1 and the magnetization of the second soft magnetic layer 3_3 are fixed in such a manner that the magnetizations are directed in the opposite directions, a magnitude of the magnetization of the entire pinned layer 3 is small. Since the magnetization is small, the magnetization of the pinned layer 3 is not easily influenced by the magnetic field from the outside, the magnetization is stabilized and pinned, and a diamagnetic field which disorders a signal magnetic field H$_{sig}$ from the magnetic disk 103 is minimized.

The middle layer 4 is a layer formed, for example, of Cu or another nonmagnetic metal with a thickness of 22 angstroms, and serves as a spacer for separating the pinned layer 3 from the free layer 5.

The free layer 5 is a layer formed, for example, of a Co—Fe—B alloy or another soft magnetic material with a thickness of 15 angstroms. The Co—Fe—B alloy fails to easily diffuse mutually with Cu constituting the middle layer 4, and is therefore preferable as the material of the free layer 5 formed on the middle layer 4.

The free layer 5 is formed of the soft magnetic material in this manner, and its magnetization is not pinned. Therefore, the magnetization rotates in a layer surface in accordance with the magnetic field from the magnetization of each one-bit region of the magnetic disk 103. Sheet resistance of a first magnetoresistive film 10_1 largely changes by a so-called giant magnetoresistive effect in accordance with an angle formed by the magnetization of the free layer 5 and the fixed magnetization of the pinned layer 3. For example, when the resistance indicates a minimum value when these magnetizations are directed in the same direction, and indicates a maximum value when these magnetizations are directed in opposite directions. A difference between the maximum value and the minimum value constitutes the resistance change Δρ/t, and the regeneration signal is outputted through the sense current by the resistance change Δρ/t.

In general, for a conductive electron in the magnetoresistive film, an average free stroke by usual scattering not dependent on spin is about 60 angstroms. When the thickness of the free layer 5 is 30 angstroms or more, the conductive electron is easily scattered before specularly reflected by an interface between the free layer 5 and the copper oxide layer 7 or the like, and a specular reflection effect fails to effectively occur. On the other hand, in the magnetoresistive film 10 in which the thickness of the free layer 5 is 30 angstroms or less, a magnetoresistive effect effectively occurs. Therefore, the free layer 5 preferably has a thickness of 30 angstroms or less.

Moreover, the free layer 5 is provided with a single magnetic domain by the bias magnetic field applied by the magnetic domain control layer 24. Therefore, in the magnetic head 30 including the free layer 5, Barkhausen noise generated in the regeneration signal accompanying a moving magnetic wall is inhibited from occurring.

The oxide layer 6 is constituted of oxidizing a layer of the material constituting the free layer 5, and is, for example, a layer obtained by oxidizing a layer of the Co—Fe—B alloy with a thickness of 20 angstroms.

The copper oxide layer 7 is a layer of an oxide including a copper element, and is, for example, a layer of $Cu_{1-x}O_x$ (0<x<1) with a thickness of 15 angstroms.

The protective layer 8 is high in anticorrosion, physically and chemically protects the copper oxide layer 7, and is here a layer of $Al_2O_3$ with a thickness of 30 angstroms. The protective layer is preferably formed of oxide to prevent further oxygen from entering the copper oxide layer 7. Moreover, $Al_2O_3$ is high in anticorrosion and strong in coupling with oxygen, and is therefore preferable as the material of the protective layer 8.

Additionally, the aforementioned respective layers are preferably provided with the thickness illustrated in the present specification and formed of the materials illustrated in the present specification, but the layers are not necessarily limited to the thickness and materials.

Among the respective layers constituting the magnetoresistive film 10 of the present embodiment, the oxide layer 6 and copper oxide layer 7 are characteristic layers of the present embodiment. Additionally, different from the magnetoresistive film 10, another magnetoresistive film 10' of the present embodiment provided with no oxide layer 6 among the oxide layer 6 and copper oxide layer 7 also produces action and effect similar to those of the magnetoresistive film 10 as described later. A constitution of the magnetoresistive film 10' will next be described. Moreover, for comparison with these magnetoresistive films 10, 10', after a conventional magnetoresistive film will be described with reference to FIG. 5, functions of these oxide layer 6 and copper oxide layer 7 will be described.

Figure 4:
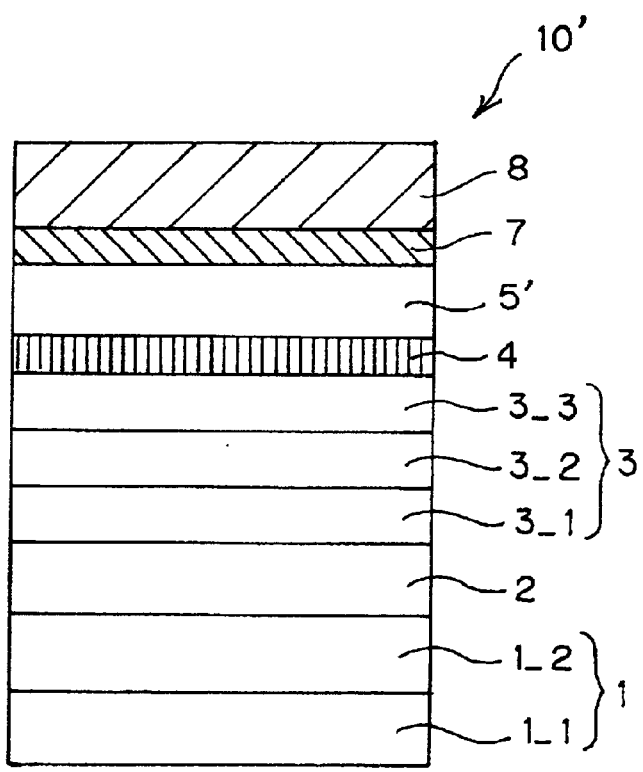
FIG. 4 is a sectional view of one example of the magnetoresistive film of the present embodiment.

FIG. 4 is a sectional view of one example of the magnetoresistive film of the present embodiment.

The magnetoresistive film 10' shown in FIG. 4 is different from the magnetoresistive film 10 shown in FIG. 3 in that the oxide layer 6 is absent, and the copper oxide layer 7 of copper oxide is formed directly on a free layer 5' formed of the same material as that of the free layer 5. Here, the thickness of the free layer 5' is the same as a sum of the thickness of free layer 5 and thickness of oxide layer 6 in the magnetoresistive film 10 of the present embodiment, that is, 35 angstroms. Additionally, the respective layers constituting the magnetoresistive film 10' fulfill the same functions as those of the respective corresponding layers constituting the magnetoresistive film 10, and produce the same action/effect.

Figure 5:
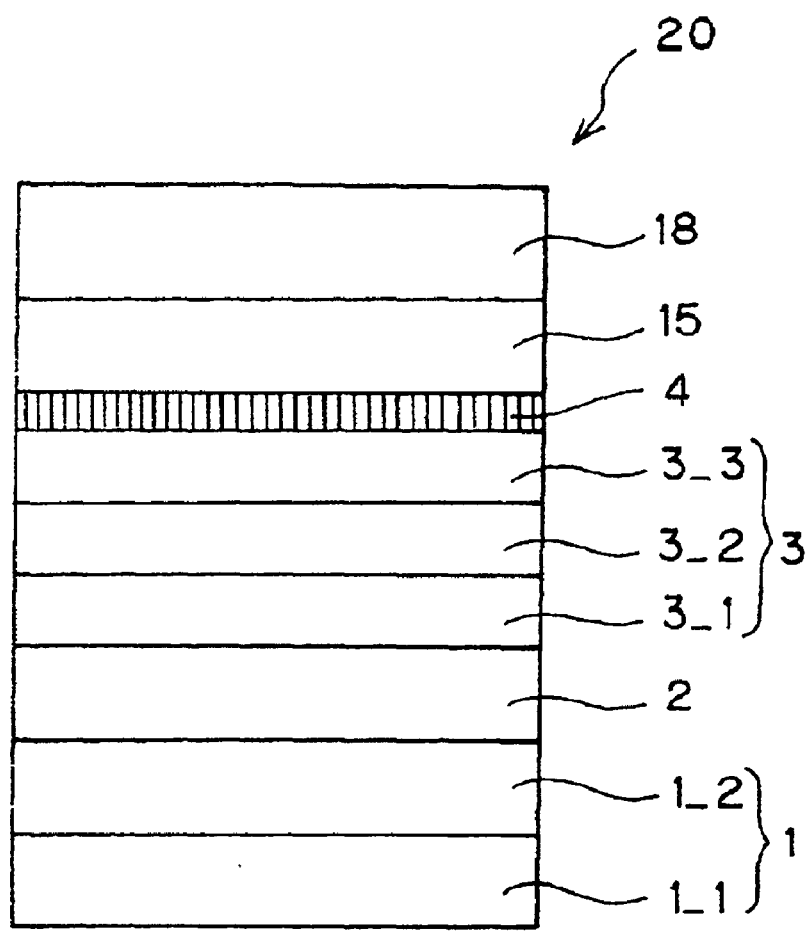
FIG. 5 is a sectional view of a conventional magnetoresistive film.

FIG. 5 is a sectional view of the conventional magnetoresistive film.

A magnetoresistive film 20 shown in FIG. 5 is a spin valve magnetoresistive film, and is different from the magnetoresistive film 10' shown in FIG. 4 in that a protective layer 18 of Ta is formed directly on a free layer 15 of the same material as that of the free layer 5'. Here, the thickness of the free layer 15 is the same as that of the free layer 5' in the magnetoresistive film 10', that is, 35 angstroms. The thickness of the protective layer 18 is 50 angstroms.

Additionally, in the general magnetoresistive film including the conventional magnetoresistive film 20 and magnetoresistive films 10, 10' of the present embodiment, since an excessive shunt current not contributing to the magnetoresistive effect flowing through the middle layer 4 is reduced to enhance the resistance change Δρ/t, thinning of the middle layer 4 is demanded as described above. However, in the conventional magnetoresistive film 20, when the thickness of the middle layer 4 is reduced, a coupling field $H_{in}$ increases, and an unnecessary deviation is generated by the coupling field $H_{in}$ in the angle formed by the free layer magnetization and the pinned layer magnetization.

In general, a resistivity of the magnetoresistive film preferably linearly changes with respect to a change of signal magnetic field $H_{sig}$, and in order to realize the linear change, it is ideal to form an angle of 90° by the magnetization directions of the pinned layer and free layer while no signal magnetic field $H_{sig}$ is applied to the magnetoresistive film. In the conventional magnetoresistive film 20, however, since the coupling field $H_{in}$ is large, the angle easily deviates from 90°. When the angle deviates from 90° in this manner, an output voltage of the magnetoresistive head using the magnetoresistive film 20 fails to linearly respond to an input of signal magnetic field $H_{sig}$, and strain of a regeneration waveform of the output voltage and other troubles easily occur.

On the other hand, in the magnetoresistive film 10' of the present embodiment, the copper oxide layer 7 is formed on the free layer 5', and this copper oxide layer 7 influences coupling between the magnetization of the free layer 5' and the magnetization of the pinned layer 3. Therefore, in the magnetoresistive film 10' of the present embodiment, as described later in the example, the coupling field $H_{in}$ is small, and the increase of the coupling field $H_{in}$ accompanying the thickness reduction of the middle layer 4 is inhibited.

Moreover, for the magnetoresistive film 10' of the present embodiment, by the presence of the copper oxide layer 7, specular reflection occurs on the interface between the free layer 5' and the copper oxide layer 7, and a large resistance change Δρ/t is generated as described later in the example.

Furthermore, in the magnetoresistive film 10 of the present embodiment, the copper oxide layer 7 is formed on the free layer 5 via the oxide layer 6, and the oxide layer 6 and copper oxide layer 7 influence the coupling between the magnetization of the free layer 5 and the magnetization of the pinned layer 3. Therefore, in the magnetoresistive film 10 of the present embodiment, as described later in the example, the coupling field $H_{in}$ is small, and the increase of the coupling field $H_{in}$ accompanying the thickness reduction of the middle layer 4 is inhibited.

Moreover, for the magnetoresistive film 10 of the present embodiment, by the presence of the oxide layer 6 and copper oxide layer 7, the specular reflection occurs in the interfaces between the free layer 5 and the oxide layer 6 and between the oxide layer 6 and the copper oxide layer 7, and the large resistance change Δρ/t is generated as described later in the example.

Here, in the magnetoresistive films 10, 10' of the present embodiment, the oxide layer 6 and copper oxide layer 7 sometimes allow the coupling field $H_{in}$ for directing the magnetization of the pinned layer 3 and the magnetization of the free layers 5, 5' in opposite directions, that is, the coupling field $H_{in}$ with a negative value to act between the magnetizations. In this case, the oxide layer 6 and copper oxide layer 7 correspond to a coupling layer referred to in the present invention.

Even for the conventional magnetoresistive film, when the middle layer 4 is sufficiently thick, the value of the coupling field $H_{in}$ becomes negative in some cases. However, for the magnetoresistive film heretofore put to practical use, the thickness of the middle layer is 34 angstroms or less. When the thickness of the middle layer 4 is 34 angstroms or less, the coupling field $H_{in}$ with a positive value acts on the magnetoresistive film. In this thickness range, the coupling field $H_{in}$ is increased by reducing the middle layer thickness. On the other hand, in the magnetoresistive films 10, 10' of the present embodiment, even when the thickness of the middle layer 4 is 34 angstroms or less, the value of the coupling field $H_{in}$ becomes negative. Therefore, the value of the coupling field $H_{in}$ can be brought close to zero by reducing the thickness of the middle layer 4.

The magnetoresistive head 30 employing the magnetoresistive films 10, 10' of the aforementioned embodiment has a large resistance change Δρ/t, the increase of the excessive coupling field $H_{in}$ accompanying the thickness reduction of the middle layer 4 is inhibited, the value of the coupling field $H_{in}$ can be brought close to zero depending on the situation, and therefore the high-output magnetic head with the inhibited regeneration waveform strain is provided.

Moreover, since the high-output magnetoresistive head 30 with the inhibited regeneration waveform strain is employed in this manner, the HDD 100 is high in sensitivity for detecting the magnetization direction of each point of a magnetic recording medium, and suitable for regeneration of the information recorded in high density on the magnetic recording medium.

A magnetoresistive film manufacture method of the present embodiment for manufacturing these magnetoresistive films 10, 10' of the present embodiment will next be described with reference to FIG. 6.

Figure 6:
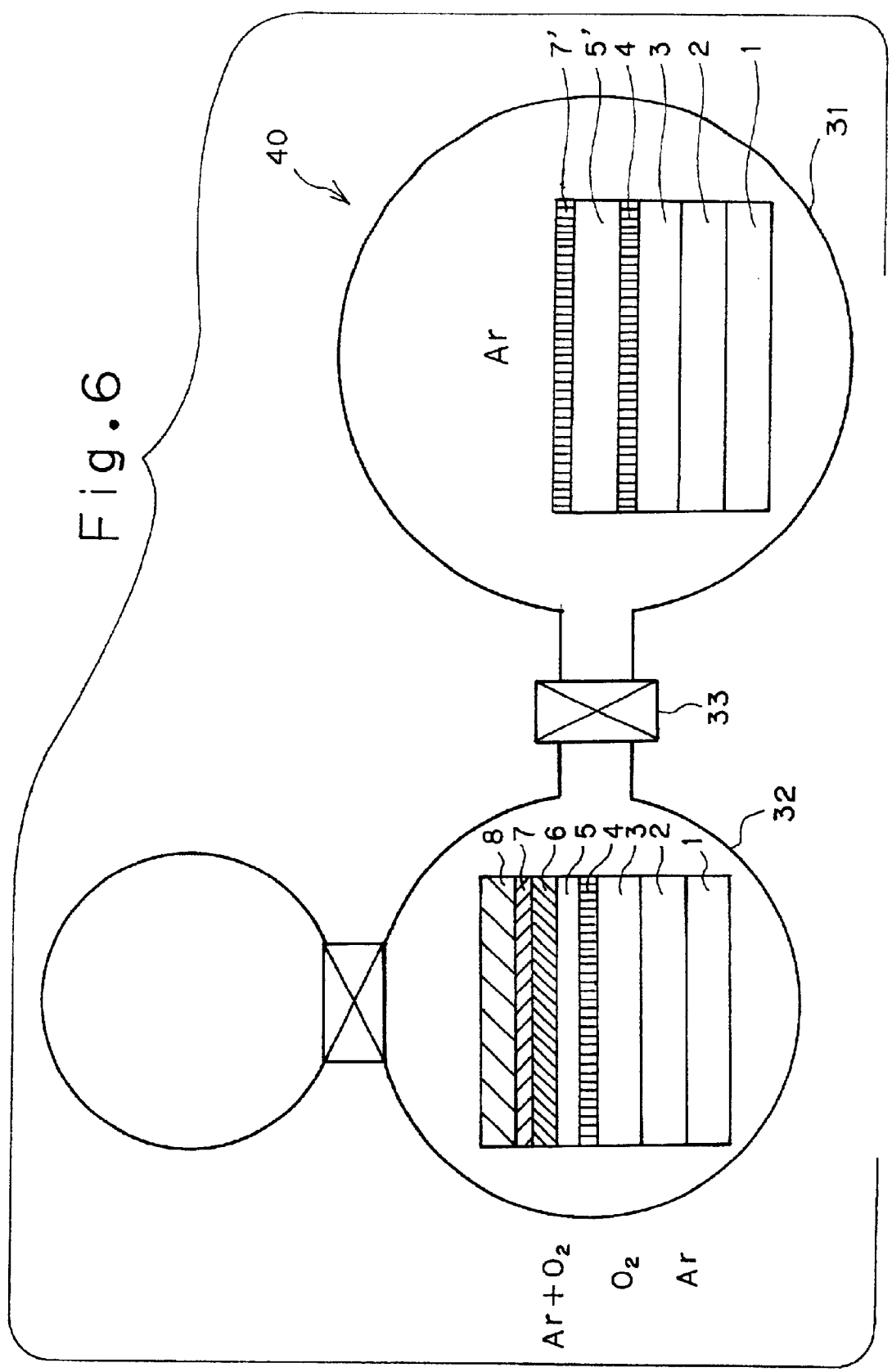
FIG. 6 is a diagram showing a magnetoresistive film forming apparatus of the present embodiment.

FIG. 6 is a diagram showing a magnetoresistive film forming apparatus of the present embodiment.

A magnetoresistive film forming apparatus 40 shown in FIG. 6 includes a main chamber 31, an insulator chamber 32 and a valve 33, and is an apparatus for performing sputtering in these chambers to form the magnetoresistive film. Here, for example, Ar gas is introduced into the main chamber 31, and pure oxygen gas is introduced into the insulator chamber 32. In addition to the oxygen gas, for example, Ar gas or mixture gas of Ar gas and oxygen gas is introduced into the insulator chamber 32. A passage for connecting the main chamber 31 to the insulator chamber 32 is disposed between the chambers, and the openable/closable valve 33 is disposed in the passage.

A process of formation of the magnetoresistive films 10, 10' will be described hereinafter.

First, for the main chamber 31 a substrate (not shown) is prepared. In order to experimentally form the magnetoresistive film, the substrate is, for example, an $Si/SiO_2$ substrate. Moreover, when the magnetoresistive film constituting the magnetic head 30 is formed, the substrate is a multilayered film of the aforementioned nonmagnetic substrate 21/lower shield layer 22/lower insulation layer 23.

On the substrate (not shown), as shown in FIG. 6, first the underlayer 1 constituting the magnetoresistive film 10, 10', antiferromagnetic layer 2, pinned layer 3, and middle layer 4 are formed in this order in Ar gas by sputtering, and the illustrated materials of the respective layers are continuously laminated in the illustrated thickness by DC magnetron sputtering to form these layers.

Subsequently, similarly by DC magnetron sputtering, a layer of a Co—Fe—B alloy with a thickness of 35 angstroms, which is equivalent to the free layer 5' of the magnetoresistive film shown in FIG. 4, is formed on the middle layer 4 laminated as described above, and further a Cu layer 7' formed of Cu with a thickness of 15 angstroms is formed on the layer equivalent to the free layer 5'. The layer equivalent to the free layer 5' forms the free layer 5' unless it is oxidized, and corresponds to the free magnetic material layer referred to in the present invention. This layer equivalent to the free layer 5' will be hereinafter referred to simply as the free layer 5'. Moreover, the Cu layer 7' corresponds to the metal layer and oxidation control layer referred to in the present invention.

The multilayered film formed up to the Cu layer 7' in this manner on the substrate is transferred to the insulator chamber 32 from the main chamber 31 by opening the valve 33, and the valve 33 is closed again. Moreover, $Al_2O_3$ is laminated by 30 angstroms on the Cu layer 7' of the multilayered film by RF magnetron sputtering in the insulator chamber 32, and the protective layer 8 of the magnetoresistive film 10, 10' is formed.

In the process of lamination of $Al_2O_3$, the Cu layer 7' is exposed to oxygen in the plasma state and plasma-oxidized, oxygen enters the Cu layer 7', and this Cu layer 7' changes to the copper oxide layer 7 of copper oxide. The magnetoresistive film 10' shown in FIG. 4 is formed by patterning the multilayered film formed up to the copper oxide layer 7 in a predetermined element shape.

Moreover, as shown in FIG. 6, in the process of lamination of $Al_2O_3$, since the Cu layer 7' is strongly oxidized, the Cu layer 7' is entirely oxidized to change to the copper oxide layer 7 and additionally only a part of the free layer 5' is plasma-oxidized in a laminar state in a thickness direction. Specifically, oxygen passes through the Cu layer 7', and further enters a part of the free layer 5'. Subsequently, the oxide layer 6 is formed by oxidizing a predetermined thickness from the side of the interface of the free layer 5' in contact with the Cu layer 7'. A non-oxidized remaining portion of the free layer 5' constitutes the free layer 5. By patterning the multilayered film with the oxide layer 6 and copper oxide layer 7 formed therein in the predetermined element shape in this manner, the magnetoresistive film 10 shown in FIG. 3 is formed.

In the conventional art, the oxide film is sometimes formed on the free layer by natural oxidation, but it is difficult to form the oxide film with a controlled desired thickness by the natural oxidation. Moreover, the oxide film can be formed on the free layer by directly performing plasma oxidation, but the direct plasma oxidation results in excessively strong oxidation. Therefore, it is difficult to form the oxide film which is controlled to have the desired thickness, and there is a possibility that an oxide film interface state becomes defective.

On the other hand, the Cu layer 7' is formed on the free layer 5' by film formation of the magnetoresistive film by the magnetoresistive film forming apparatus 40, and a part of the free layer 5' is oxidized through the Cu layer 7' by a plasma oxidation process. Therefore, the oxide layer 6 obtained by oxidizing a part of the free layer 5' can be formed while control is performed in order to provide the desired thickness. Moreover, by forming the oxide layer 6 while controlling the thickness, the coupling field $H_{in}$ can be controlled. Furthermore, since the oxidation is moderately performed, the interface between the oxide layer 6 and free layer 5 is considered to be satisfactory.

Since the Cu layer 7' has a function of controlling oxidation degree of the free layer 5' as described above, a certain degree of thickness or more is necessary. In other words, in order to appropriately control the oxidation degree and effectively reduce the coupling field $H_{in}$ in the magnetoresistive film 10, 10', the copper oxide layer 7 obtained by oxidizing the Cu layer 7' needs to have a certain degree of thickness or more. As seen later from the example, the copper oxide layer 7 preferably has a thickness of 10 angstroms or more. Therefore, similarly, the Cu layer 7' also preferably has a thickness of 10 angstroms or more.

Moreover, by performing the oxidation of the free layer 5' to a depth of 5 angstroms or more, the oxide layer 6 preferably has a thickness of 5 angstroms or more. Usually, like the interface between the free layer 5' and the copper oxide layer 7, that is, the interface between the oxide layer 6 and the copper oxide layer 7, the interface of two layers formed by lamination usually has a roughness of about 5 angstroms, but like the interface between the oxide layer 6 and the non-oxidized remaining free layer 5, the interface formed by oxidation is considered to constitute a smooth interface.

For the magnetoresistive film 10, since the thickness of the oxide layer 6 is 5 angstroms or more, substantially the entire interface between the oxide layer 6 and free layer 5 becomes smooth, the coupling field $H_{in}$ decreases, and the specular reflection of the conductive electron is considered to be satisfactorily performed on the interface. As described later in the example, actually, when the oxide layer 6 has a thickness of 5 angstroms or more, the inhibition of the increase of the coupling field $H_{in}$ is effectively performed, and the resistance change Δρ/t indicates a further large value.

Additionally, in the aforementioned magnetoresistive film manufacture method, the inside of the insulator chamber 32 is a pure oxygen atmosphere, but when the oxides such as $Al_2O_3$ are laminated in the insulator chamber 32, an Ar gas atmosphere may be used, and a part of oxygen generated by sputtering $Al_2O_3$ plasma-oxidizes the Cu layer 7' and free layer 5'.

Moreover, the inside of the insulator chamber 32 may be an atmosphere of mixture gas of oxygen and Ar, and in this case, by changing a mixture ratio, the oxidation degree of the Cu layer 7' and further the thickness of the oxide layer 6 can be controlled.

Even when the plasma oxidation is performed simultaneously with the lamination of the oxides such as $Al_2O_3$ in the insulator chamber 32, the coupling field $H_{in}$ of the finally formed magnetoresistive film tends to be reduced in the atmosphere including oxygen in the insulator chamber 32, rather than in the pure Ar gas atmosphere.

Moreover, even when the lamination of the oxides such as $Al_2O_3$ fails to be performed, the plasma oxidation of the Cu layer 7' and free layer 5' is performed by setting the inside of the insulator chamber 32 to the atmosphere including oxygen.

Additionally, the oxidation state of the Cu layer 7' or the free layer 5' is influenced by introduced power during sputtering, additionally gas pressure and gas mixture ratio, material and thickness of the protective layer 8, material and thickness of the copper oxide layer 7, and other conditions. The thickness of the oxide layer 6 can also be changed by adjusting these conditions.

Moreover, instead of the Cu layer 7', a layer of a metal other than Cu may be laminated on the free layer 5'. Even when the layer of the metal other than Cu is laminated on the free layer 5', the oxidation of the free layer 5' is considered to be appropriately controlled by the layer of the metal. Additionally, when the layer of Cu is formed on the free layer 5' as shown in the example, the coupling field $H_{in}$ can actually be minimized as a result, and the layer of Cu or an alloy including Cu is preferably formed on the free layer 5'.

Additionally, the film formation of the protective layer 8 can also be performed by subjecting a metal target to reactive sputtering in the mixture gas of Ar and oxygen.

Moreover, a film forming method is not limited to sputtering, and any means may be used as long as the oxidation of the free layer 5' can be controlled through the oxidation of the layer of the metal laminated on the free layer 5'.

EXAMPLES

An example of the present invention will be described hereinafter.

Dependence on Middle Layer Thickness

Measurement results of the resistance change Δρ/t of the magnetoresistive film and measurement results of a change of the coupling field $H_{in}$ with respect to the middle layer thickness will be described hereinafter.

The measurement was performed with respect to seven samples of the magnetoresistive film 10 of the present embodiment shown in FIG. 3. Here, the respective seven samples have the middle layers 4 of Cu with respective different thickness values between 18 angstroms and 30 angstroms, and the respective layers other than the middle layer 4 are provided with the illustrated thickness and materials of the magnetoresistive film 10 of the present embodiment for all the samples.

For these samples, the films were formed in the method described in the embodiment by the magnetoresistive film forming apparatus 40 shown in FIG. 6. Here, an $Si/SiO_2$ substrate was used as the substrate for forming the magnetoresistive film, and each target for use in sputtering had a diameter of 5 cm. Moreover, the introduced power of DC magnetron sputtering to the target in the main chamber 31 was set to 50 W, and the introduced power of RF magnetron sputtering to the target in the insulator chamber 32 was set to 150 W. Moreover, the inside of the main chamber 31 was set to Ar atmosphere of 0.7 Pa, and the inside of the insulator chamber 32 was set to the oxygen atmosphere of 0.06 Pa.

Moreover, for comparison, the measurement was also performed with respect to five samples of the conventional magnetoresistive film 20 shown in FIG. 5. Here, the respective five samples include the middle layers 4 of Cu with different thickness values between 24 angstroms and 32 angstroms, and the respective layers constituting these samples, other than the middle layer 4, are provided with the illustrated thickness and materials of the conventional magnetoresistive film 20 for all the samples.

The respective layers constituting the respective five samples were formed by the magnetoresistive film forming apparatus 40 shown in FIG. 6 similarly as in the formation of the magnetoresistive film of the present embodiment in the seven samples. Additionally, since the respective layers constituting the five samples were all conductive materials, all the layers were formed in the main chamber 31 in the magnetoresistive film forming apparatus 40.

Figure 7:
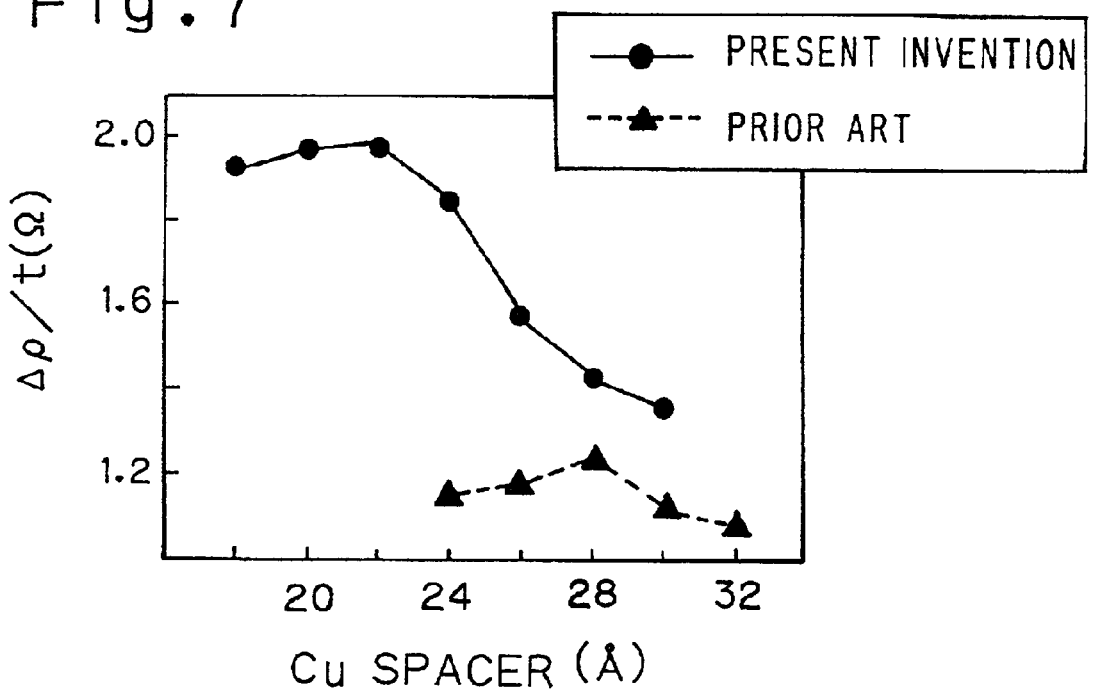
FIG. 7 is a graph showing dependence of a resistance change $\Delta\rho/t$ of the magnetoresistive film on a thickness of a middle layer.

FIG. 7 is a graph showing the dependence of the resistance change Δρ/t of the magnetoresistive film on the middle layer thickness.

Figure 8:
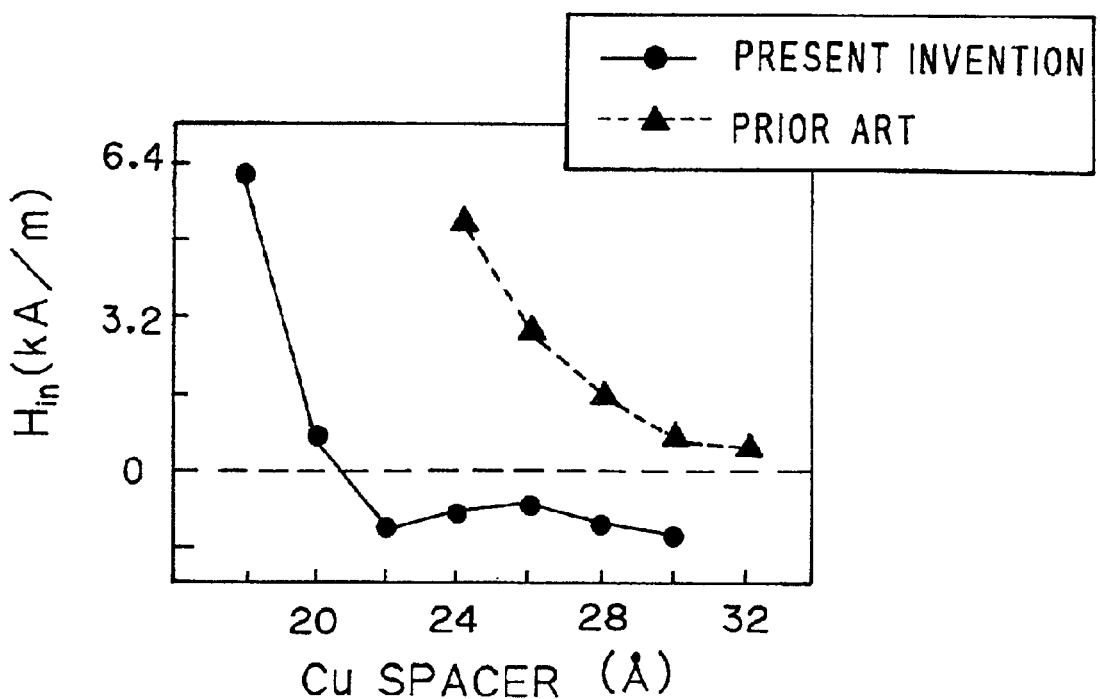
FIG. 8 is a graph showing the dependence of a coupling field $H_{in}$ of the magnetoresistive film on the thickness of the middle layer.

FIG. 8 is a graph showing the dependence of the coupling field $H_{in}$ of the magnetoresistive film on the middle layer thickness.

The abscissa of FIG. 7, 8 indicates the thickness of the middle layer 4 which is a Cu spacer of the magnetoresistive film, the ordinate of FIG. 7 shows the resistance change Δρ/t of the magnetoresistive film, and the ordinate of FIG. 8 shows the coupling field $H_{in}$ of the magnetoresistive film. In FIGS. 7, 8, the measurement results for the seven samples of the magnetoresistive film 10 of the present embodiment are shown by black circles, and the measurement results for the five samples of the conventional magnetoresistive film 20 are shown by black triangles. These black circles are guided and connected to one another by a solid line, and the black triangles are guided and connected to one another by a dotted line.

As shown by a plurality of black triangles of FIG. 7, in the conventional magnetoresistive film 20, when the thickness of the middle layer 4 is reduced to 28 angstroms from 32 angstroms, the resistance change Δρ/t increases. However, the resistance change Δρ/t reaches its limit at the thickness of 28 angstroms; on the contrary, the resistance change decreases when the thickness of 28 angstroms decreases to 24 angstroms. Moreover, in the conventional magnetoresistive film 20, when the thickness of the middle layer 4 is between 24 angstroms and 32 angstroms, the resistance change Δρ/t is between 1.05Ω and 1.25Ω, and there is little change by the thickness of the middle layer 4.

On the other hand, as shown by a plurality of black circles of FIG. 7, in the magnetoresistive film 10 of the present embodiment, when the thickness of the middle layer 4 is reduced to 22 angstroms from 30 angstroms, the resistance change Δρ/t monotonously increases to 1.9Ω or more from 1.4 Ω or less, and a value of 1.9Ω or more is kept for the thickness of the middle layer 4 between 24 angstroms and 20 angstroms.

As described above, the sample of the magnetoresistive film 10 constituted by forming the copper oxide layer 7 on the free layer 5 via the oxide layer 6 indicated a larger resistance change Δρ/t than that of the conventional magnetoresistive film 20 for any thickness of the middle layer 4. The large resistance change Δρ/t is considered to be caused by the specular reflection of the conductive electron in the interfaces between the free layer 5 and the oxide layer 6 and between the oxide layer 6 and the copper oxide layer 7.

As shown by a plurality of black triangles of FIG. 8, in the conventional magnetoresistive film 20, when the thickness of the middle layer 4 is reduced to 24 angstroms from 32 angstroms, the coupling field $H_{in}$ monotonously increases to 5.3 kA/m from 0.5 kA/m. On the other hand, as shown by a plurality of black circles of FIG. 8, for the magnetoresistive film 10 of the present embodiment, at the thickness of the middle layer 4 between 30 angstroms and 22 angstroms, the coupling field $H_{in}$ is within a range of −0.5 kA/m to −1.5 kA/m and takes a negative value. The coupling field $H_{in}$ of the magnetoresistive film 10 monotonously increases when the thickness of the middle layer 4 is reduced to 18 angstroms from 22 angstroms, turns to be positive at 20 angstroms, and exceeds 6 kA/m at 18 angstroms.

As described above, the negative coupling field $H_{in}$ is realized in some sample of the magnetoresistive film 10 of the present embodiment in which the copper oxide layer 7 is formed on the free layer 5 via the oxide layer 6. Moreover, in the magnetoresistive film 10, while a magnitude of the coupling field $H_{in}$ is kept to be small, the thickness of the middle layer 4 can be decreased to a smaller thickness as compared with the conventional magnetoresistive film 20.

Dependence on Thickness of Copper Oxide Layer

Measurement results of changes of the resistance change Δρ/t, coercive force $H_{in}$ and coupling field $H_{in}$ of the magnetoresistive film with respect to the thickness of the copper oxide layer 7 will be described hereinafter.

The measurement was performed on eight samples including six samples of the magnetoresistive film 10 of the present embodiment shown in FIG. 3. For these eight samples, the film formation was performed by the method described in the embodiment by the magnetoresistive film forming apparatus 40 shown in FIG. 6 on the same conditions as the conditions of the substrate, target diameter, introduced power, and atmosphere in the respective chambers during the film formation of seven samples for use in the measurement of the dependence on the middle layer thickness. Specifically, each of these eight samples is constituted by forming up to the free layer 5' on the substrate, forming the Cu' layer 7' on the free layer 5', laminating $Al_2O_3$ on the Cu layer 7' to subject the Cu layer 7' to plasma oxidation and to form the copper oxide layer 7, further oxidizing the free layer 5' from the side of the Cu layer 7', and forming the oxide layer 6 on the non-oxidized remaining free layer 5. Additionally, the thickness of the Cu layer 7' differs with each sample between 0 angstrom and 35 angstroms, and the thickness of the Cu layer 7' corresponds to the thickness of the copper oxide layer 7. Moreover, the thickness of the free layer 5' is 35 angstroms, the depth in the film thickness direction in which oxygen enters the free layer 5' differs in accordance with the thickness of the Cu layer 7', and therefore the thickness of the non-oxidized remaining free layer 5 and oxidized oxide layer 6 also differs in accordance with the thickness of the Cu layer 7'. As described above, the respective layers other than the copper oxide layer 7, oxide layer 6, and free layer 5 constituting the samples have the illustrated thickness and are formed of the illustrated materials of the magnetoresistive film 10 of the present embodiment, whether or not the respective layers constitute the samples. Additionally, among the eight samples, for the sample in which the thickness of the copper oxide layer 7 is 0 angstrom, that is, the sample provided with no copper oxide layer 7, the thickness of the oxide layer 6 is 20 angstroms. For the sample in which the thickness of the copper oxide layer 7 is 25 angstroms, the thickness of the oxide layer 6 is 5 angstroms. Moreover, in the sample in which the thickness of the copper oxide layer 7 is 35 angstroms, the thickness of the oxide layer 6 is 0 angstrom, that is, the sample fails to include the oxide layer 6. Like the magnetoresistive film 10' shown in FIG. 4, the copper oxide layer 7 is directly formed on the free layer 5. The thickness of the oxide layer 6 was measured by shaving the sample and evaluating a composition of a shaved surface by XPS.

Figure 9:
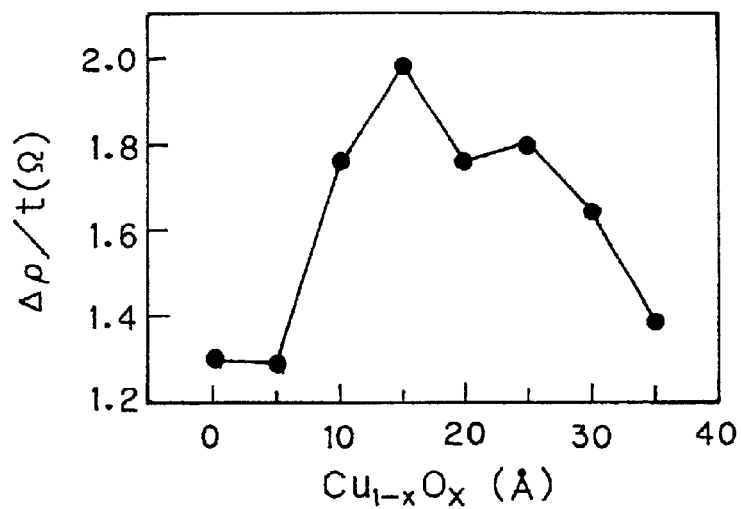
FIG. 9 is a graph showing the dependence of the resistance change $\Delta\rho/t$ of the magnetoresistive film on the thickness of a copper oxide layer.

FIG. 9 is a graph showing the dependence of the resistance change $\Delta\rho/t$ of the magnetoresistive film on the thickness of the copper oxide layer.

Figure 10:
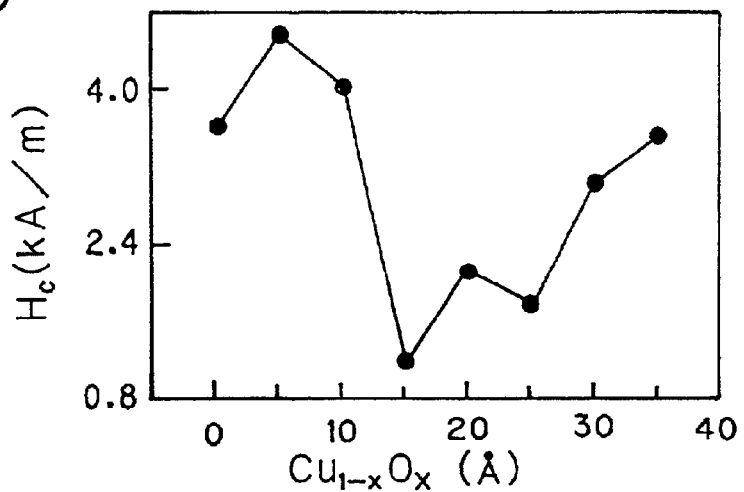
FIG. 10 is a graph showing the dependence of a coercive force $H_c$ of the magnetoresistive film on the thickness of the copper oxide layer.

FIG. 10 is a graph showing the dependence of the coercive force $H_c$ of the magnetoresistive film on the thickness of the copper oxide layer.

Figure 11:
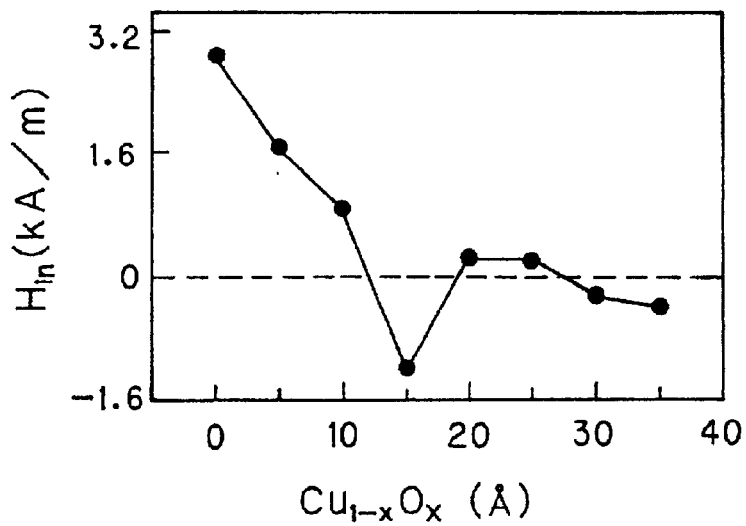
FIG. 11 is a graph showing the dependence of the coupling field $H_{in}$ of the magnetoresistive film on the thickness of the copper oxide layer.

FIG. 11 is a graph showing the dependence of the coupling field $H_{in}$ of the magnetoresistive film on the thickness of the copper oxide layer.

Each abscissa of FIGS. 9, 10, 11 indicates the thickness of the copper oxide layer 7 formed of $Cu_{1-x}O_x$ of the magnetoresistive film. The ordinate of FIG. 9 shows the resistance change $\Delta\rho/t$ of the magnetoresistive film, the ordinate of FIG. 10 shows the resistance change coercive force $H_c$ of the magnetoresistive film, and the ordinate of FIG. 11 shows the coupling field $H_{in}$ of the magnetoresistive film. In these drawings, the measurement results for the eight samples are shown by black circles, and the black circles are guided and connected to one another by the solid line.

The measurement result of the coupling field $H_{in}$ will first be noted.

As shown in FIG. 11, the coupling field $H_{in}$ is as large as 2.9 kA/m when the thickness of the copper oxide layer 7 is 0 angstrom, monotonously decreases as the thickness of the copper oxide layer 7 increases, decreases to 0.8 kA/m at the thickness of the copper oxide layer 7 of 10 angstroms, and decreases to −1.2 kA/m at 15 angstroms. Moreover, when the thickness of the copper oxide layer 7 is in a range of 20 angstroms to 35 angstroms, the coupling field $H_{in}$ indicates a small value within a range of −0.5 kA/m to 0.3 kA/m.

Since the coupling field $H_{in}$ of 0.8 kA/m or less is usually requested for the magnetic head of the magnetoresistive film, it is seen from the above measurement result of the coupling field $H_{in}$ that the thickness of the copper oxide layer 7 is preferably 10 angstroms or more. Moreover, the thickness of the copper oxide layer 7 is more preferably in a range of 10 angstroms to 35 angstroms.

Next, the measurement results of the resistance change $\Delta\rho/t$, coercive force $H_c$, and coupling field $H_{in}$ will comprehensively be described.

As shown in FIGS. 9, 10, 11, for the sample in which the thickness of the copper oxide layer 7 is 0 angstrom and the thickness of the oxide layer 6 is 20 angstroms, the resistance change $\Delta\rho/t$ is as low as 1.3Ω, the coupling field $H_{in}$ is as large as 2.9 kA/m, and therefore this sample is not very preferable as the magnetoresistive film.

Moreover, in this case, the sample coercive force $H_c$ is 3.5 kA/m.

When the thickness of the sample copper oxide layer 7 increases to 10 angstroms from 0 angstrom, the resistance change $\Delta\rho/t$ rises to 1.75Ω, the coupling field $H_{in}$ decreases to 0.8 kA/m, and therefore the sample is preferable as the magnetoresistive film.

When the thickness of the sample copper oxide layer 7 increases to 15 angstroms, the resistance change $\Delta\rho/t$ indicates a maximum value of 2Ω, the coupling field $H_{in}$ decreases to −1.2 kA/m to indicate a minimum value, further the coercive force $H_c$ decreases to 1.2 kA/m, and therefore the sample is preferable as the magnetoresistive film.

Moreover, when the thickness of the sample copper oxide layer 7 increases to 35 angstroms from 15 angstroms, the coupling field $H_{in}$ indicates a satisfactory value within a range of −0.5 kA/m to 0.3 kA/m, but the resistance change $\Delta\rho/t$ decreases to 1.4Ω from 2.0Ω. The decrease of the resistance change $\Delta\rho/t$ is considered to be caused by the thinning of the oxide layer 6 in the vicinity of 35 angstroms.

Here, when the thickness of the copper oxide layer 7 is 25 angstroms or less, the thickness of the oxide layer 6 is 5 angstroms or more. When the oxide layer 6 has a thickness of 5 angstroms or more, the coupling field $H_{in}$ further decreases to −1.2 kA/m, the resistance change $\Delta\rho/t$ increases to 1.7 kA/m or more, the coercive force $H_c$ decreases to 2.2 kA/m and preferable properties are provided in this manner. Therefore, it is seen that the thickness of the oxide layer 6 is preferably 0.5 angstroms or more. Additionally, when the thickness of the oxide layer 6 is increased, that is, when the thickness of the copper oxide layer 7 is reduced, the respective properties are deteriorated. A cause of the deterioration lies in the decrease of the thickness of the copper oxide layer 7, except the thickness of the oxide layer 6.

With the thickness of the sample copper oxide layer 7 of 35 angstroms, since the thickness of the oxide layer 6 is 0 angstrom, the sample corresponds to one magnetoresistive film 10' of the present embodiment. As seen from the results shown in FIG. 7, the value of the resistance change $\Delta\rho/t$ of 1.4Ω is larger than the value of the resistance change $\Delta\rho/t$ estimated in the conventional magnetoresistive film 20 which corresponds to the sample and whose middle layer 4 thickness is 22 angstroms. Moreover, for the sample, the value of the coupling field $H_{in}$ of −0.5 kA/m is lower than the value of the coupling field $H_{in}$ when the thickness of the middle layer 4 shown in FIG. 8 is 22 angstroms. It is seen from this result that the magnetoresistive film 10' indicates the resistance change larger than that of the conventional magnetoresistive film 20, and indicates a low coupling field $H_{in}$.

As described above, according to the present invention, there are provided the magnetoresistive film in which the increase of the coupling field accompanying the thickness reduction of the middle layer is inhibited, the magnetoresistive head provided with the magnetoresistive film, the information regeneration apparatus provided with the magnetoresistive head, and the magnetoresistive film manufacture method for manufacturing the magnetoresistive film.

What is claimed is:

1. A magnetoresistive film comprising a multilayer film including: a pinned magnetic layer having magnetization whose direction is fixed; a nonmagnetic middle layer formed on the pined magnetic layer; and a free magnetic layer formed on the middle layer and provided with magnetization whose direction changes in accordance with an external magnetic field, and indicating a magnitude of resistance in accordance with an angle formed by the magnetization direction of the pinned magnetic layer and the magnetization direction of the free magnetic layer, wherein a copper oxide layer of an oxide including a copper element is formed directly on said free magnetic layer, or on the free magnetic layer via an oxide layer comprising a material fabricated by oxidation of a material constituting the free magnetic layer, wherein the copper oxide layer cases specular reflection on, without applying a bias magnetic field to, an interface between the copper oxide layer and the free magnetic layer when the copper oxide layer is formed directly on the free magnetic layer, and wherein the copper oxide layer causes specular reflection on, without applying a bias magnetic field to, an interface between the free magnetic layer and the oxide layer and on the interface between the oxide layer and the copper oxide layer when the copper oxide layer is formed on the free magnetic layer via the oxide layer.

2. The magnetoresistive film according to claim 1 wherein said copper oxide layer has a thickness of 10 angstroms or more.

3. The magnetoresistive film according to claim 1 wherein said oxide layer has a thickness of 5 angstroms or more.

4. The magnetoresistive film according to claim 1 wherein a protective layer for protecting the copper oxide layer is formed on said copper oxide layer.

5. The magnetoresistive film according to claim 4 wherein said protective layer comprises an oxide.

6. The magnetoresistive film according to clam 5 wherein said protective layer comprises $Al_2O_3$.

7. The magnetoresistive film according to claim 1 wherein said free magnetic layer has a thickness of 30 angstroms or less.

8. A magnetoresistive head comprising a magnetoresistive film as a multilayered film including: a pinned magnetic layer having magnetization whose direction is fixed; a nonmagnetic middle layer formed on the pinned magnetic layer; and a free magnetic layer formed on the middle layer and provided with magnetization whose direction changes in accordance with an external magnetic field and indicating a magnitude of resistance in accordance with an angle formed by the magnetization direction of the pinned magnetic layer and the magnetization direction of the free magnetic layer, and detecting the magnitude of the resistance of the magnetoresistive film to detect a strength of the external magnetic field, wherein a copper oxide layer of an oxide including a copper element is formed directly on said free magnetic layer, or on the free magnetic layer via an oxide layer comprising a material fabricated by oxidation of a material constituting the free magnetic layer, wherein the copper oxide layer causes specular reflection on, without applying a bias magnetic field to, an interface between the copper oxide layer and the free magnetic layer when the copper oxide layer is formed directly on the free magnetic layer, and wherein the copper oxide layer causes specular reflection on, without applying a bias magnetic field to, an interface between the free magnetic layer and the oxide layer and on the interface between the oxide layer and the copper oxide layer when the copper oxide layer is formed on the free magnetic layer via the oxide layer.

9. An information regeneration apparatus comprising a magnetic head, disposed in the vicinity of or in contact with a magnetic recording medium on which information is recorded by a magnetization on direction, for detecting the magnetization direction of each point of the magnetic recording medium, and regenerating the information in accordance with the magnetization direction of each point of said magnetic recording medium detected by the magnetic head, wherein said magnetic head comprises a magnetoresistive film as a multilayered film including: a pinned magnetic layer having magnetization whose direction is fixed; a nonmagnetic middle layer formed on the pinned magnetic layer; and a free magnetic layer formed on the middle layer and provided with magnetization whose direction changes in accordance with an external magnetic field, and indicating a magnitude of resistance in accordance with an angle formed by the magnetization direction of the pinned magnetic layer and the magnetization direction of the free magnetic layer, and detects the magnitude of the resistance of the magnetoresistive film to detect a strength of the external magnetic field, and a copper oxide layer of an oxide including a copper element is formed directly on said free magnetic layer, or on the free magnetic layer via an oxide layer formed of a material fabricated by oxidation of a material consisting the free magnetic layer, wherein the copper oxide layer causes specular reflection on, without applying a bias magnetic field to, an interface between the copper oxide layer and the free magnetic layer when the copper oxide layer is formed directly on the free magnetic layer, and wherein the copper oxide layer causes specular reflection on, without applying a bias magnetic field to, an interface between the free magnetic layer and the oxide layer and on the interface between the oxide layer and the copper oxide layer when the copper oxide layer is formed on the free magnetic layer via the oxide layer.

10. A magnetoresistive film manufacture method for manufacturing a magnetoresistive film as a multilayered film including: a pinned magnetic layer having magnetization whose direction is fixed; a nonmagnetic middle layer formed on the pinned magnetic layer; and a free magnetic layer formed on the middle layer and provided with magnetization whose direction changes in accordance with an external magnetic field, and indicating a magnitude of resistance in accordance with an angle formed by the magnetization direction of the pinned magnetic layer and the magnetization direction of the free magnetic layer, said method comprising:
free magnetic material layer lamination step of laminating said middle layer, and subsequent laminating a free magnetic material layer including a material constituting said free magnetic layer on the middle layer;
a metal layer lamination step of laminating a copper metal layer on the free magnetic material layer laminated in said free magnetic material layer lamination step; and a plasma oxidation step of exposing the copper metal layer laminated by said metal layer lamination step to oxygen in a plasma state to oxidize the copper metal layer and form a copper oxide layer, and wherein the copper oxide layer causes specular reflection on, without applying a bias magnetic field to, an interface between the copper oxide layer and the free magnetic layer when the copper oxide layer is formed on the free magnetic layer.

11. The magnetoresistive film manufacture method according to claim 10 wherein said plasma oxidation step comprises a step of oxidizing said copper metal layer, and a part of said free magnetic material layer on the side of the copper metal layer.

12. The magnetoresistive film manufacture method according to claim 10 wherein said plasma oxidation step is performed simultaneously with lamination of a new layer on said copper metal layer.

13. A magnetoresistive film manufacture method for manufacturing a magnetoresistive film as a multilayered film including: a pinned magnetic layer having magnetization whose direction is fixed; a nonmagnetic oxide layer formed on the pinned magnetic layer; and a free magnetic layer formed on the middle layer and provided with magnetization whose direction changes in accordance with an external magnetic field and indicating a magnitude of resistance in accordance with an angle formed by the magnetization direction of the pinned magnetic layer and the magnetization direction of the free magnetic layer, said method comprising:

a free magnetic material layer lamination step of laminating a free magnetic material layer comprising a material constituting said free magnetic layer on said middle layer;

an oxidation control layer lamination step of laminating a predetermined copper oxidation control layer on the free magnetic material layer laminated in said free magnetic material layer lamination step; and a plasma oxidation step of exposing the oxidation control layer laminated by said oxidation control layer lamination step to oxygen in a plasma state to oxidize said free magnetic material layer to a predetermined depth in a thickness direction from an oxidation control layer side through the oxidation control layer and form a copper oxide layer on said free magnetic layer, and wherein the copper oxide layer causes specular reflection on, without applying a bias magnetic field to, and interface between the copper oxide layer and the free magnetic layer when the copper oxide layer is formed on the free magnetic layer.

* * * * *

UNITED STATES PATENT AND TRADEMARK OFFICE
CERTIFICATE OF CORRECTION

PATENT NO. : 6,759,120 B2
DATED : July 6, 2004
INVENTOR(S) : Jongill et al.

It is certified that error appears in the above-identified patent and that said Letters Patent is hereby corrected as shown below:

Column 24,
Line 11, delete "consisting" and insert -- contituting -- therefor.
Line 36, insert -- a -- between "method comprising:" and "free magnetic" therefor.
Line 66, delete "oxide" and insert -- middle -- therefor.

Column 25,
Line 3, please delete "field" and insert -- field, -- therefor.

Signed and Sealed this

Fourth Day of January, 2005

JON W. DUDAS
*Director of the United States Patent and Trademark Office*